United States Patent
Chen et al.

(10) Patent No.: US 8,574,513 B2
(45) Date of Patent: Nov. 5, 2013

(54) SINGLE-LAYER PCB MICROFLUIDICS

(75) Inventors: Samson Chen, Pasadena, CA (US);
Aditya Rajagopal, Irvine, CA (US);
Axel Scherer, Barnard, VT (US)

(73) Assignee: California Institute of Technology, Pasadena, CA (US)

( * ) Notice: Subject to any disclaimer, the term of this patent is extended or adjusted under 35 U.S.C. 154(b) by 14 days.

(21) Appl. No.: 13/448,810

(22) Filed: Apr. 17, 2012

(65) Prior Publication Data
US 2012/0267239 A1   Oct. 25, 2012

Related U.S. Application Data

(60) Provisional application No. 61/477,481, filed on Apr. 20, 2011.

(51) Int. Cl.
*G01N 15/06* (2006.01)
(52) U.S. Cl.
USPC .............. 422/503; 422/50; 422/68.1; 422/81; 436/43; 436/63; 436/174; 436/180
(58) Field of Classification Search
USPC ......... 422/50, 68.1, 81, 502, 503; 436/43, 63, 436/174, 180
See application file for complete search history.

(56) References Cited

U.S. PATENT DOCUMENTS

| | | | |
|---|---|---|---|
| 5,804,881 A | 9/1998 | Wille et al. | |
| 6,786,708 B2 | 9/2004 | Brown et al. | |
| 8,220,487 B2 * | 7/2012 | Unger et al. | 137/614.11 |
| 8,243,358 B2 * | 8/2012 | Wen et al. | 359/288 |
| 8,372,726 B2 * | 2/2013 | de Graff et al. | 438/457 |
| 8,382,896 B2 * | 2/2013 | Hansen et al. | 117/68 |
| 2004/0013545 A1 | 1/2004 | Brown et al. | |
| 2007/0095879 A1 | 5/2007 | Holmes | |
| 2008/0057627 A1 | 3/2008 | Chang | |
| 2008/0101044 A1 | 5/2008 | Chang | |

OTHER PUBLICATIONS

PCT International Search Report mailed on Oct. 24, 2012 for PCT Application No. PCT/US2012/033914 filed on Apr. 17, 2012 in the name of California Institute of Technology et al.
PCT Written Opinion mailed on Oct. 24, 2012 for PCT Application No. PCT/US2012/033914 filed on Apr. 17, 2012 in the name of California Institute of Technology et al.

* cited by examiner

*Primary Examiner* — Brian J Sines
(74) *Attorney, Agent, or Firm* — Steinfl & Bruno, LLP

(57) ABSTRACT

A printed circuit board structure is coated with an encapsulant within which microfluidic channels have been formed. The microfluidic channels are formed by soldering fluidic connections to metal traces on a surface of the printed circuit board structure prior to encapsulation. The metal traces are removed by etching after encapsulation to form microchannels within the encapsulant.

9 Claims, 7 Drawing Sheets

SINGLE-LAYER PCB MICROFLUIDICS

CROSS-REFERENCE TO RELATED APPLICATIONS

The present application is related to and claims the benefit of the following copending and commonly assigned U.S. patent application: U.S. Patent Application No. 61/477,481, titled "Single-Layer PCB Microfluidics," filed on Apr. 20, 2011; the entire contents of this application are incorporated herein by reference.

BACKGROUND

1. Field

The present disclosure relates to the field of microfluidics and, in particular, to microfluidic devices and related methods and systems.

2. Description of Related Art

Microfluidics generally refers to the flow of fluids within microchannels. Microchannels are generally defined as channels whose dimensions are less than 1 mm and a greater than 1 μm. Above 1 mm, the fluid flow exhibits behavior that is the same as most macroscopic flows. Below 1 μm, the fluid flow may be better characterized as nanoscopic. Microfluidic flows differ from macrofluidic flows in that behaviors such as energy dissipation, surface tension, and fluidic resistance start to dominate the flow. Such characteristics of microfluidic flows are beneficial in a number of applications, such as chemical and biological analysis.

Microchannel fluidics may be provided in a printed circuit board (PCB) structure through the use of multiple layers that are fastened together. For example, U.S. Pat. No. 6,786,708, issued on Sep. 7, 2004, describes a PCB structure that consists of multiple layers of a chosen substrate or multiple types of substrates. The inner layers in the PCB structure are used as a hollow channel through which fluid can flow. Multichip module laminate technology is used to bond together the separate layers in a stack. Such PCB structures using inner layers of the PCB structure for the formation of microchannels may be referred to as "inner layer" PCB fluidic structures.

As disclosed in U.S. Pat. No. 6,786,708, the inner layers of the PCB structure are used to provide the microchannels. By photolithographic or milling operations, a section of a particular layer can be etched or machined away. Repeating this process for multiple layers and fastening the layers together in a typical laminate or PCB manufacturing process allows for the formation of multiple channels within the inner layers of the PCB structure. Holes in the outer layers of the PCB structure allow for fluids to enter and exit the channels within the PCB structure. FIG. 1 depicts fluidic channels 10 formed within a multilayer printed circuit board substrate 5. Vias 20 are used to provide fluidic or electric communication to the channels 10 buried within the multilayer substrate 5. Injection molded parts may be bonded to the PCB structure to provide for fluid ports and other such fluid handling apparatus.

While inner layer PCB microfluidic channels are constructed using well known PCB fabrication techniques, these techniques become increasing complex and expensive as additional layers are used to fabricate the microchannels. Much of the complexity and expense is due to the accurate alignment of the additional layers that must be achieved to obtain properly formed microchannels. Further, while several layers of an inner layer PCB microfluidic structure may be copper or other metal, allowing for electrical signals to be routed through the structure, components that may be used for monitoring or controlling the fluidic flow are mounted on the external layers of the PCB structure. Hence, these components cannot contact fluids that are flowing within inner layers of the structure.

SUMMARY

Described herein are devices, apparatus, and methods according to embodiments of the present invention that provide for microfluidic channels. A printed circuit board structure is coated with an encapsulant within which microfluidic channels have been formed. The microfluidic channels are formed by soldering fluidic connections to metal traces on a surface of the printed circuit board structure prior to encapsulation. The metal traces are removed by etching after encapsulation to form microchannels within the encapsulant.

One aspect is a microfluidic structure comprising: a substrate encapsulated in an encapsulant; one or more microfluidic channels disposed on or within the substrate; and, at least one fluidic connection soldered to the substrate or metallic structures disposed on the substrate and wherein the at least one fluidic connection is in fluidic communication with at least one microfluidic channel of the one or more microfluidic channels and is configured to enable flow of an etchant to or from the at least one microfluidic channel and some portion of the at least one fluidic connection is encapsulated within the encapsulant.

Another aspect is a method for forming a microfluidic structure, where the method comprises: depositing one or more outer layer traces on a surface of a substrate; attaching one or more fluidic connections at selected locations on or near the one or more outer layer traces; encapsulating the substrate and the one or more outer layer traces with an encapsulant; after encapsulating the substrate, providing etchant to the one or more outer layer traces through at least one of the one or more fluidic connections; etching material comprising the one or more outer layer traces with the etchant, removing the material comprising the one or more outer layer traces through at least one of the one or more fluidic connections, where removal of the material comprising the one or more outer layer traces results in the formation of one or more outer layer microfluidic channels within the encapsulant at the surface of the substrate.

Another aspect is a microfluidic structure comprising: a substrate; a microfluidic channel contained within the substrate, a first fluidic connector projecting through a first surface of the substrate and in contact with the microfluidic channel, wherein the first fluidic connector comprises a first metallic tube comprising a first solderable metal and the first metallic tube is contained within a first via hole of the substrate, and a first annular solder seal around the fluidic connector at a location where the first fluidic connector projects through the first surface of the substrate.

The details of one or more embodiments of the invention are set forth in the accompanying drawings and the description below. Other features, objects, and advantages will be apparent from the description and drawings, and from the claims.

DETAILED DESCRIPTION

The present disclosure describes the formation of fluidic channels in a printed circuit board structure. Such channels and associated fluidic structures within a printed circuit board provide for the control and monitoring of micro-fluidic flow within a printed circuit board.

Embodiments of the present invention employ "outer layer" PCB fluidics for the formation of microchannel fluidic PCB structures. In this form of PCB fluidics, a lower cost double- or single-sided PCB is coated with a polymer encapsulant, such as epoxy, PDMS, or parylene, depending on the application. Using tubes mounted onto the board using standard soldering techniques before the encapsulation process, some of the copper traces on the board are left exposed through the encapsulant. These traces are then removed using either a chemical or electrochemical etching process. This leaves an opening for fluids to travel through.

Figure 2:
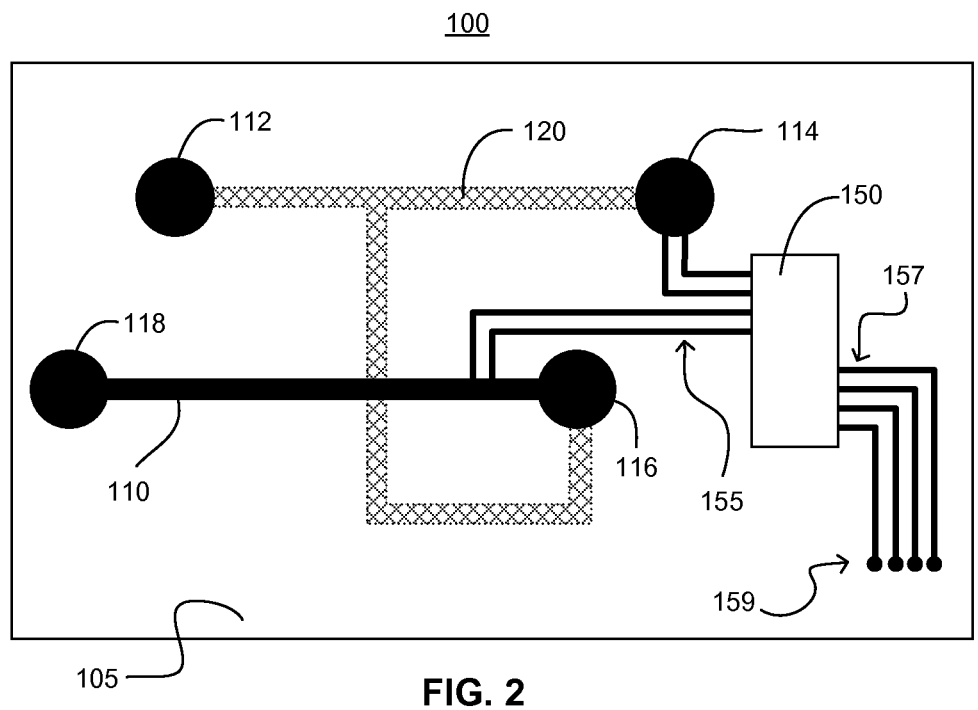
FIG. 2 shows a top down view of a printed circuit board upon which outer layer fluidic channels are to be formed.

FIGS. 2-7 show a process for fabricating an "outer layer" PCB fluidic structure. FIG. 2 shows a top down view of a printed circuit board 100 upon which an outer layer copper trace 110 and copper via locations 112, 114, 116 have been deposited on a substrate 105. The trace 110 and copper via locations 112, 114, 116 may be deposited using printed circuit board fabrication techniques well known in the art. The printed circuit board also contains an inner layer copper trace 120 within the substrate 105. The outer layer copper trace 110, inner layer copper trace 120, and copper via locations 112, 114, 116 will be used to form fluidic channels as described in additional detail below. An electrical component 150 and metal electrical interconnects 155 to locations where fluidic channels will be formed have also been deposited on the board. Additional metal interconnects 157 are terminated with off-board electrical interconnect locations 159. As can be seen from FIG. 2, the printed circuit board 100 allows for electrical components and fluidic channels to be contained on the same board.

Figure 3:
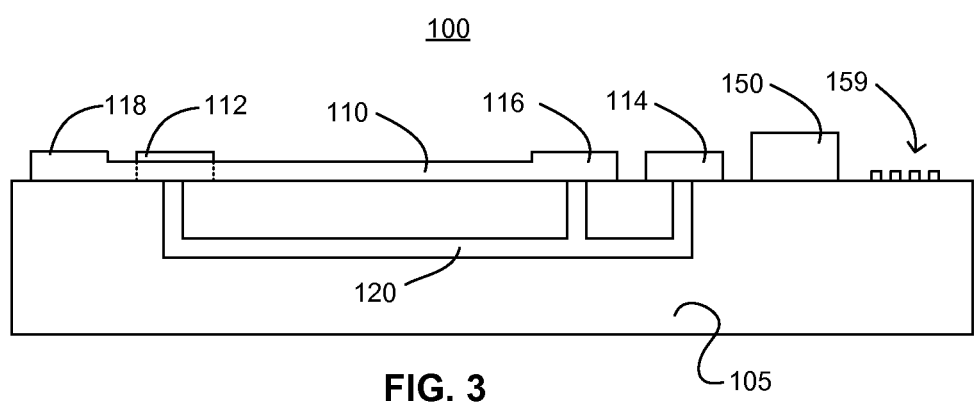
FIG. 3 shows a side view of the printed circuit board shown in FIG. 2.

FIG. 3 shows a side view of the printed circuit board 100 shown in FIG. 2. FIG. 3 shows the inner layer copper trace 120 connected to the copper via locations 112, 114, and 116. The inner layer copper trace 120 may be fabricated by printed circuit board techniques well known in the art, such as photolithographic techniques. While FIGS. 2 and 3 show only a single outer layer copper trace 110 and a single inner layer copper trace 120, those skilled in the art will understand that the printed circuit board may be fabricated to contain multiple outer layer 110 and inner layer 120 copper traces. Similarly, the printed circuit board may contain multiple electrical components 150.

Figure 4:
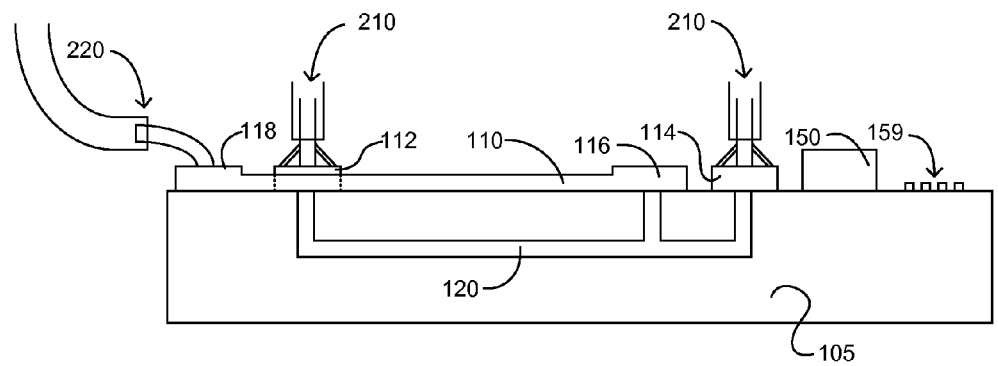
FIG. 4 shows the attachment of fluidic connections to the printed circuit board shown in FIG. 3.

FIG. 4 shows the attachment of vertical fluidic connections 210 to the copper via locations 112 and 114. FIG. 4 also shows the attachment of a horizontal fluidic connection to another copper via location 118. The attachment and structure of the fluidic connections 210, 220 are described in additional detail below. Note that the fluidic connections 210, 220 have hollow portions that allow for the flow of fluid as described in additional detail below. Note that one of the copper via locations 116 does not receive a fluidic connection since it has been fabricated to provide a connection between the outer layer copper trace 110 and the inner layer copper trace 120.

Figure 5:
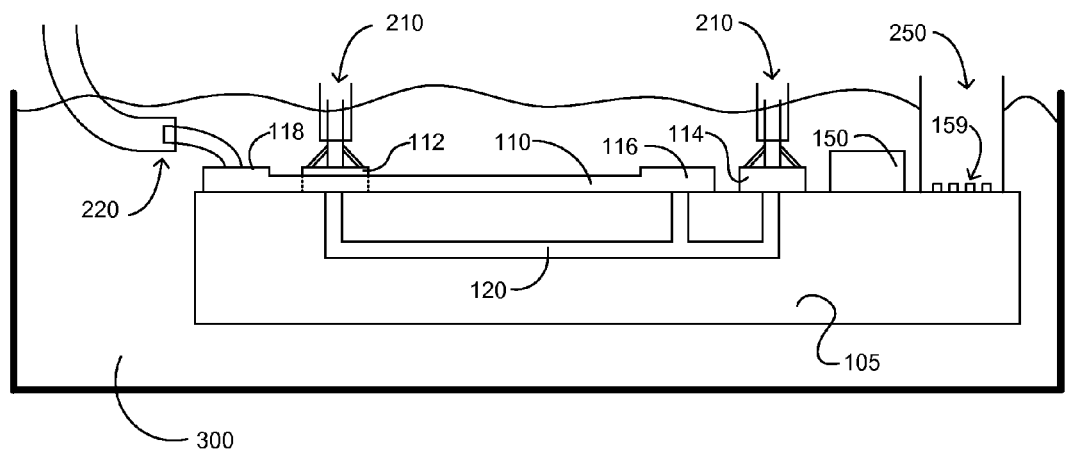
FIG. 5 shows the immersion of the printed circuit board shown in FIG. 4 in an encapsulant bath.

FIG. 5 shows the immersion of the printed circuit board 100 with the attached fluidic connections 210, 220 into a polydimethylsiloxane (PDMS) or other encapsulant bath 300. The printed circuit board 100 is immersed the encapsulant will cover the outer layer copper trace 110, the via locations 112, 114, 116, 118, and the electrical component 150. The encapsulant should also cover and form around the bottom portions of the fluidic connections 210, 220, but leave the upper portions uncovered to allow the flow of fluid into the fluidic connections 210, 220. A solder mask 250 or other removable material may be placed above the off-board electrical interconnects 159 to mask them from the encapsulant.

Figure 6:
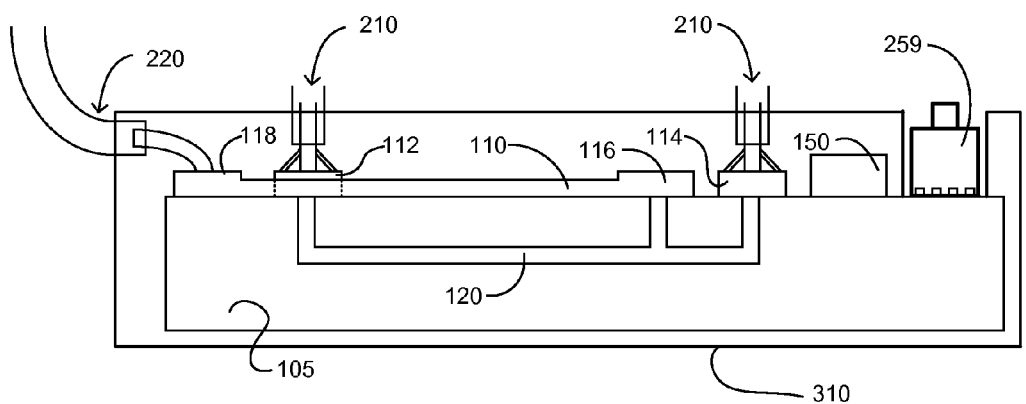
FIG. 6 shows the printed circuit board depicted in FIGS. 4 and 5 after encapsulation.

FIG. 6 shows the structure after the encapsulant is molded around the printed circuit board 100 to form the encapsulated structure 310. FIG. 6 also shows that the solder mask above the off-board electrical interconnects 159 has been removed and an electrical connection 259 to the off-board electrical interconnects 159. Note that the fluidic connections 210, 220 project outside of the encapsulated structure 310. Etchant can then be pumped into the encapsulated structure 310 via the fluidic connections 210, 220 or an electrochemical etch may be used. Etching is used to remove the outer layer copper trace 110 and inner layer copper trace 120. Etching will also remove the copper at the via locations 112, 114, 116, 118.

Figure 7:
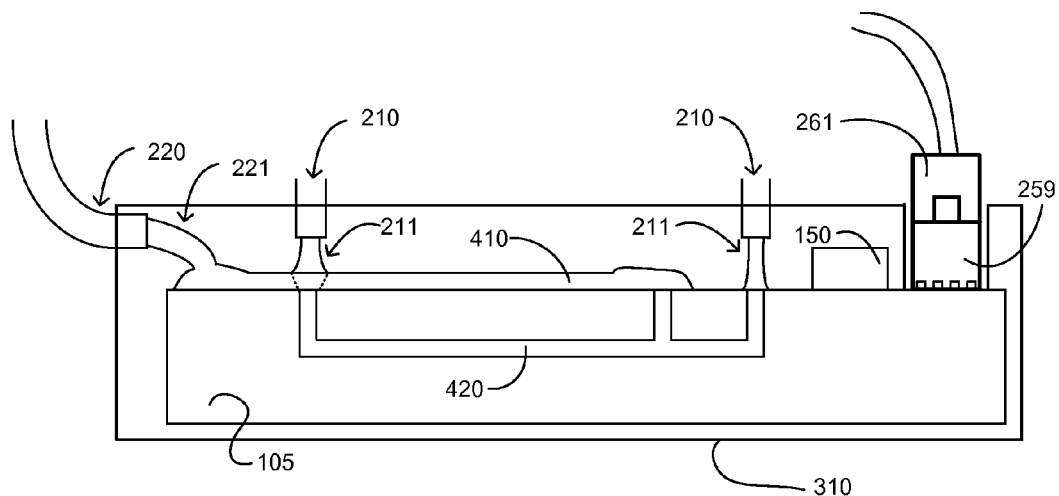
FIG. 7 shows the microfluidic structure resulting from etching the printed circuit board shown in FIG. 6.

FIG. 7 shows the structure resulting from etching copper from the encapsulated structure 310. The removal of copper from the outer layer copper trace 110 forms an outer layer fluidic channel 410 in the encapsulated structure 310. The removal of the copper from the inner layer copper trace 120 forms an inner layer fluidic channel 420 within the substrate 105. The etchant also removes a portion of the copper at the fluidic connection 220 to the via location 118 to form a fluidic transition 221 from the fluidic connection 220 to the outer layer fluidic channel 410. Similarly, the etchant removes a portion of the copper at the fluidic connections 210 to the via locations 112, 114 that lead to the inner layer fluidic channel 420 to form fluidic transitions 211 within the encapsulated structure 310 from the fluidic connections 210 to the inner layer fluidic channel 420. FIG. 7 also shows an electrical connector 261 attached to the electrical connection 259 to provide for electrical control over the electrical component 150 encapsulated within the encapsulated structure 310. As noted above in regard to FIG. 2, the metal electrical interconnects 155 may disposed to contact fluid flowing within the outer layer fluidic channel 410 and the inner layer fluidic channel 420 to provide sensing for fluid flowing within those channels 419, 420.

Figure 1:
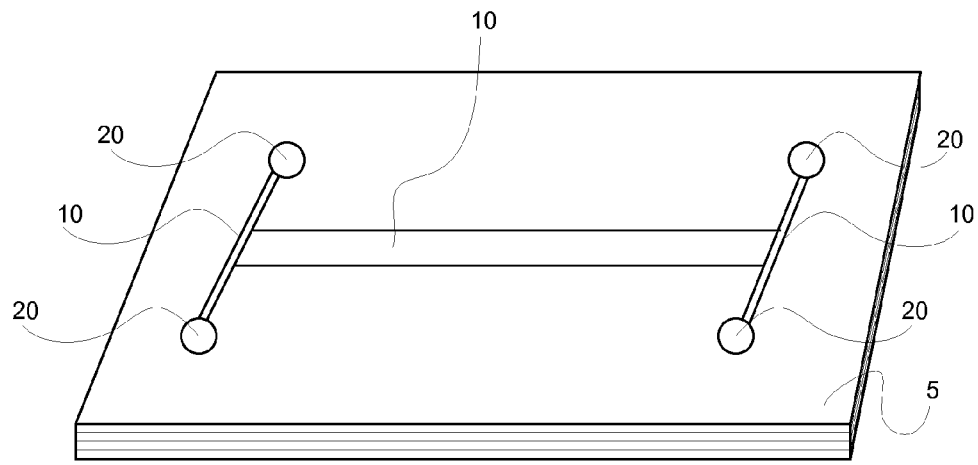
FIG. 1 (prior art) depicts a fluidic channel formed within a printed circuit board structure.
Figure 8:
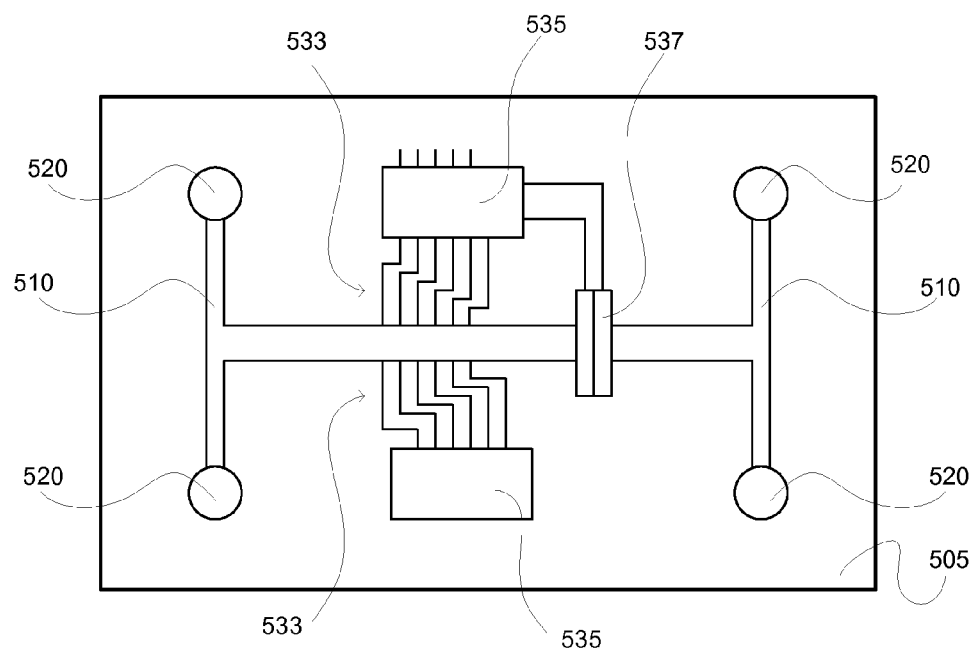
FIG. 8 shows a device with electronics integrated with outer layer fluidic channels.

FIG. 8 shows a device with electronics integrated with outer layer fluidic channels 510 disposed on top of a substrate 505 and formed within an encapsulant. Fluidic connections 520 provide for fluidic communication with the fluidic channels 510. Electronic devices 535 disposed on the substrate 505 provide control over electro-osmatic pump contacts 533 that are use to control the flow of fluid within the microfluidic channel 510. Capacitive sensors 537 coupled to electronic devices 535 provide for monitoring of the flow within the channel 510. The electro-osmatic pump contacts 533 may be either shorted directly and grounded to prevent significant electroplating etch or separated by dissoluble polymer. The pump contacts 533 may also be formed with a metal or metals resistant to etchants used in removing other metal structures. For example, tin is resistant to most ammoniacal-based copper etchants. Etchants-resistant metals, such as tin, may also be used as an etch-resistant mask in outer layer processing. The electronic devices 535, electro-osmatic pump contacts 533, and capacitive sensors 537 may be protected by using a macroscale mask during fabrication. This macroscale mask may be constructed out of a chemically resistant polymer such as AZ5214, SPR220, S1813, or dry-film photoresists resists. Other materials may be used as long as the masking materials can be selectively removed in subsequent processing.

Figure 9:
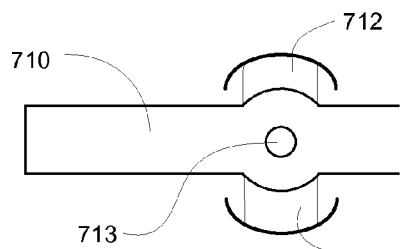
FIG. 9 shows a solderable port for receiving a fluidic connection.
Figure 10:
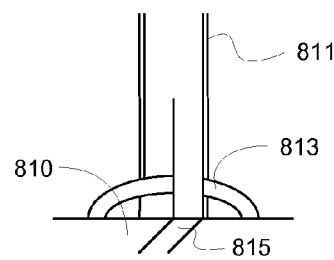
FIG. 10 shows a vertical fluidic connection.
Figure 11:
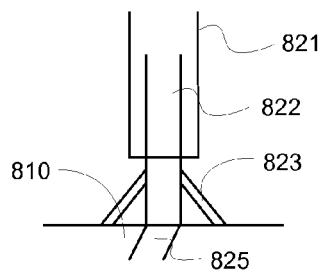
FIG. 11 shows another vertical fluidic connection.
Figure 12:
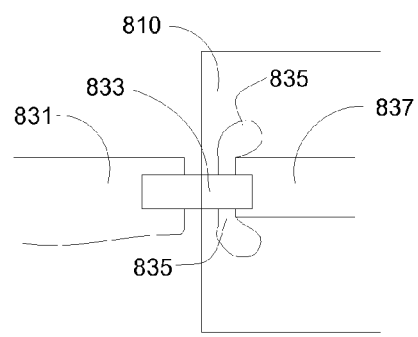
FIG. 12 shows an edge mounted fluidic connection.

Directing fluid into and out of the channels formed on or within a printed circuit board structure requires that fluidic connections be formed or mounted with techniques that are compatible with PCB fabrication. FIGS. 9-12 above show various structures and techniques that may be used to fasten fluidic connections to outer layer fluidic channels, such as the outer layer fluidic channel 310 shown in FIG. 7. FIG. 9 shows a solderable port for receiving a fluidic connection that allows for fluid transfer to a channel 710. In FIG. 9, a center tube 713 provides for fluid transfer while metal portions 712 provide areas at which solder can be applied to attach a fluidic connection to the port. FIGS. 10-12 show various fluidic connections that may be used. FIG. 10 shows vertical fluidic connection that has a silicone or plastic tube 811 coupled to a metal ring 813 that fixes the tube 811 above a trace 815 to be etched on a printed circuit board surface 810. After etching, the trace 815 becomes a channel for fluid flow. The metal ring 813 may be attached to the printed circuit board surface 810 with solder or other attachment techniques. FIG. 11 shows another vertical fluidic connection that has a preinstalled silicone tube 821 installed around a metal tube 822. Solder 823 encircles the metal tube 822, holds the metal tube 822 against the printed circuit board surface 810 and provides for a seal of the metal tube 822 against a trace 825. After etching, the trace 825 becomes a channel for fluid flow from the metal tube 822. FIG. 12 shows an edge mounted fluidic connection with a preinstalled silicone or polymer tube 831 coupled to a metal tube 833 that projects onto a trace 837 on a printed circuit board surface 810. Solder 835 is used to hold the metal tube 835 in place. After etching, the trace 837 becomes a fluidic channel. Note that etching may cause some portions of the metal tube 822, 835 in FIGS. 11 and 12 to be removed or etched, when etching is used to remove traces 825, 837. However, the encapsulant seals the channel, so removal of portions of the tubes within the channel during etching should not impact the formed micro-channel.

Figure 13:
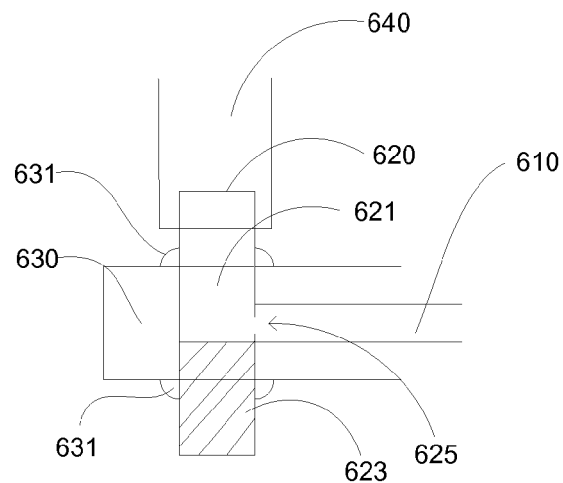
FIG. 13 shows a fluidic connector component for connecting an inner layer PCB fluidics channel compatible with standard soldering techniques.
Figure 14:
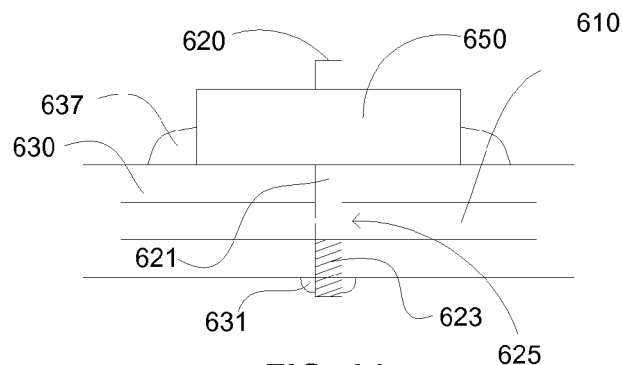
FIG. 14 shows an electrical component attached to a metallic tube for sensing an inner layer PCB fluidics channel.

Techniques and structures similar to those shown in FIGS. 9-12 may also be used to provide fluidic connections to inner layer fluidic channels, such as the inner layer fluidic channel 320 shown in FIG. 7. FIGS. 13 and 14 show structures and techniques that may be used with inner layer fluidic channels. Note that the structures and techniques shown in FIGS. 13 and 14 may be used in structures that have a combination of outer layer and inner layer fluidics (such as the structure shown in FIG. 7) or in structures that only utilize inner layer fluidics.

FIG. 13 shows a fluidic connector component for connecting an inner layer PCB fluidics channel compatible with standard soldering techniques. In FIG. 13, a supply tube 640 is coupled to an inner layer fluid channel 610 in a PCB substrate 630 using a metal tube 620, where the metal tube is fixed to the PCB layer 630 with solder 631. The supply tube 620 may be standard plastic tubing used for fluids. The metal tube 620 consists of solderable material. Half of the metal tube 620 is machined to have a hollow upper portion 621 and a solid lower portion 623. The metal tube 620 is also machined with an opening 625 cut in the side to permit fluid to flow from an external source through the hollow upper portion 621 of the tube 620 and through the side opening 625 to the inner layer fluid channel 610. The metal tube 620 is inserted after the fabrication of the inner layer fluidic structures (either copper structures to be etched to form fluidic channels or hollow fluidic channels themselves). The metal tube 620 is inserted like a standard through-hole PCB component into a via hole in the PCB substrate and then soldered at the seams with solder 631 to produce a liquid-tight seal. In FIG. 13, the metal tube 620 is preferably made of metal resistant to etchants used in forming inner layer PCB fluidic channels. Generally, just about any metal other than copper may be used (for example, stainless steel plated with tin for solderability) if copper is used to form the inner layer PCB fluidics channels, since the ammoniacal etchants used in the PCB industry are specific for copper only.

Figure 17:
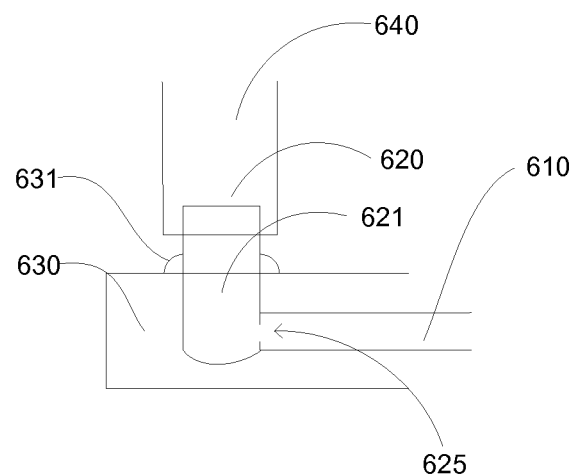
FIG. 17 shows the installation of a metallic tube into a blind via that does not extend through a PCB substrate and provides access to an inner layer fluidics channel.

Note that FIG. 13 shows the metal tube 620 soldered at both the upper surface and lower surface of the PCB substrate 610. The metal tube 620 may be alternatively soldered at only one surface. FIG. 17 shows the installation of the metallic tube 620 into a blind via that does not extend through the lower surface of the PCB substrate 630. FIG. 17 shows that the metallic tube 620 is not perfectly flat so that the tube 620 may be manually inserted or automatically inserted by PCB assembly equipment without tolerance as to how deep the tube 620 is inserted or a need to solder both the upper and lower surface of the PCB substrate 630. The metallic tube 620 still has an upper hollow portion 621 and a side opening 625 that allows access to the inner layer fluidic channel 610. The upper hollow portion 621 may also be partially contained within a supply tube 640. Note that the solder 631 shown in FIG. 17 is preferably applied to provide an annular seal around the tube 620. The solder 631 is also preferably applied in this manner in the techniques and structures depicted in FIG. 13.

FIG. 14 shows a structure similar to that shown in FIG. 13. However, as shown in FIG. 14, the metallic tube 620 (which may have a smaller diameter than the width of the fluidic channel 610) is attached to an electrical component 650 that is positioned on top of the PCB substrate 630. The electrical component 650 may be a standard packaged integrated circuit chip. The metallic tube 620 may then allow the electrical component 650 to sample the electrical potential, pressure, or even the fluid itself. If the electrical component is sampling the fluid or pressure within the inner layer fluid channel 610, FIG. 14 shows that tube 620 may have a hollow upper portion 621 and a solid lower portion 623 with openings 625 provided in sides of the hollow upper portion 621 to allow access to the fluid. Similar to the device shown in FIG. 13, the device shown in FIG. 14 may be inserted like a standard through-hole PCB component. The tube is held in place with solder 631 at the lower surface of the PCB substrate 630. The electrical component 650 may be held in place with solder 637 or other fastening techniques. Note also, that the metallic tube 620 may be one or more electrodes to provide electrical contact with the fluid in the inner layer fluid channel 610.

Figure 15:
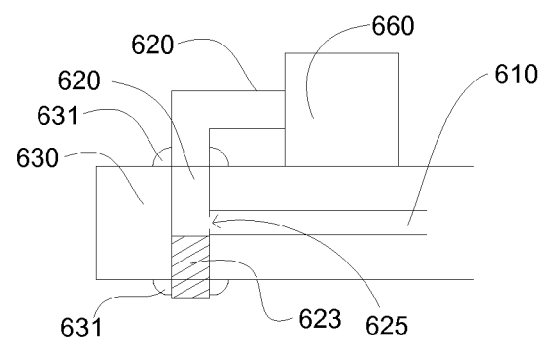
FIG. 15 shows a pump mounted on a PCB substrate to pump fluid into and out of an inner layer fluid channel.

Using techniques similar to those shown in FIGS. 13 and 14, FIG. 15 shows a pump 660 mounted on the PCB substrate 630 to pump fluid into and out of the inner layer fluid channel 610. The metal tube 620 is also machined with an opening 625 cut in the side to permit fluid to flow from the pump 660 through the hollow upper portion 621 of the tube 620 and through the side opening 625 to the inner layer fluid channel 610. The metal tube 620 is inserted like a standard through-hole PCB component into a via hole in the PCB substrate and then soldered at the seams with solder 631 to produce a liquid-tight seal. Note that FIG. 15 shows the metal tube 620 soldered at both the upper surface and lower surface of the PCB substrate 610. The metal tube 620 may be alternatively soldered at only one surface.

Figure 16:
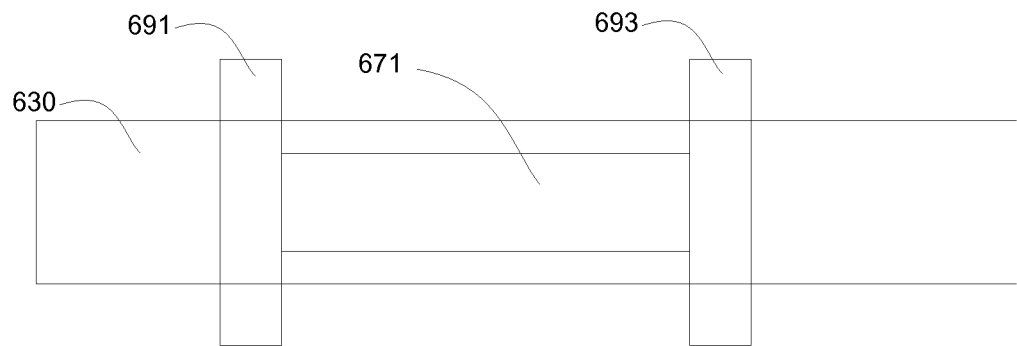
FIG. 16 shows an electrochemical cell formed by an inner layer fluidic channel.

Fabrication of microfluidic channels in a printed circuit board and the fluidic channel access techniques and structures shown in FIGS. 13 and 14 may also provide for the fabrication of batteries within a PCB. FIG. 16 shows a channel 671 in a PCB substrate 630. Electrolyte is introduced into an inner layer fluidic chamber 671. In this configuration, the electrolyte provides an electrochemical cell. The inner layer fluidic chamber 671 is plugged with two different solderable metal cylinders 691, 693 which serve as fluidic plugs and as the anode 691 and cathode 693 of the electrochemical cell. The solderable metal cylinders 691, 693 are fastened with solder seals 631 to ensure that the electrolyte liquid does not escape. The metal cylinders 691, 693 can then be electrically connected to a circuit or circuits on the same PCB substrate 630 (or a circuit on another substrate) to provide electrical power for the circuit.

Note that the microfluidic channels and structures described above may be constructed on or within rigid PCB substrates known in the art, such as FR-4. Microfluidic channels may also be fabricated to provide for biocompatibility, where flexible circuit materials or substrates may be used. For example, Kapton, a flexible circuit material, may be used for the PCB substrates discussed above or other portions of the structures described above. Therefore, the microfluidic fabrication techniques and structures described herein apply to both rigid and flexible structures and may be particularly adapted for biocompatibility applications. The PCB substrate and/or the encapsulant may comprise transparent or semi-transparent material, allowing for optical access to fluids flowing within outer layer and/or inner layer microchannels.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. In particular it is to be understood that the disclosures are not limited to particular compositions or biological systems, which can, of course, vary.

This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. It is also to be understood that the terminology used herein is for the purpose of describing particular embodiments only, and is not intended to be limiting. Reference to a claim element in the singular is not intended to mean "one and only one" unless explicitly so stated. As used in this specification and the appended claims, the singular forms "a," "an," and "the" include plural referents unless the content clearly dictates otherwise. The term "several" includes two or more referents unless the content clearly dictates otherwise. Unless defined otherwise, all technical and scientific terms used herein have the same meaning as commonly understood by one of ordinary skill in the art to which the disclosure pertains.

Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . "

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A microfluidic structure comprising:
    a substrate encapsulated in an encapsulant;
    one or more microfluidic channels disposed on or within the substrate; and,
    at least one fluidic connection soldered to the substrate or metallic structures disposed on the substrate and wherein the at least one fluidic connection is in fluidic communication with at least one microfluidic channel of the one or more microfluidic channels and is configured to enable flow of an etchant to or from the at least one microfluidic channel and some portion of the at least one fluidic connection is encapsulated within the encapsulant.

2. The microfluidic structure according to claim 1, wherein the one or more microfluidic channels comprise at least one outer layer microfluidic channel formed within the encapsulant and disposed on a surface of the substrate.

3. The microfluidic structure according to claim 2, wherein the at least one outer layer microfluidic channel comprises a void in the encapsulant formed by application of the etchant to one or more metal traces on the surface of the substrate.

4. The microfluidic structure according to claim 1, further comprising one or more electrical components disposed on the substrate and encapsulated within the encapsulant.

5. The microfluidic structure according to claim 1, wherein the one or more microfluidic channels comprise at least one inner layer microfluidic channel formed within the substrate.

6. The microfluidic structure according to claim 5, wherein the at least one inner layer microfluidic channel comprises a void in the substrate formed by application of the etchant to one or more metal traces within the substrate.

7. The microfluidic structure according to claim 1, wherein the encapsulant comprises polydimethylsiloxane.

8. The microfluidic structure according to claim 1, wherein the substrate comprises a rigid substrate or a flexible substrate.

9. The microfluidic structure according to claim 1, wherein the at least one fluidic connection comprises a metal tube comprising one or more metals resistant to the etchant.

* * * * *